US006667144B2

(12) United States Patent
Maejima et al.

(10) Patent No.: US 6,667,144 B2
(45) Date of Patent: Dec. 23, 2003

(54) LASER-INDUCED THERMAL TRANSFER INK SHEET, PRODUCTION METHOD OF THE SAME, AND IMAGE RECORDING METHOD

(75) Inventors: Katsumi Maejima, Hino (JP); Tomohisa Ohta, Hino (JP); Taro Konuma, Hino (JP); Tatsuichi Maehashi, Hino (JP)

(73) Assignee: Konica Corporation (JP)

( * ) Notice: Subject to any disclaimer, the term of this patent is extended or adjusted under 35 U.S.C. 154(b) by 0 days.

(21) Appl. No.: 10/080,155

(22) Filed: Feb. 20, 2002

(65) Prior Publication Data

US 2002/0192588 A1 Dec. 19, 2002

(30) Foreign Application Priority Data

Feb. 27, 2001 (JP) .................................... 2001-052030

(51) Int. Cl.$^7$ .............................. G03F 7/11; G03F 7/34
(52) U.S. Cl. .................... 430/201; 430/200; 430/271.1
(58) Field of Search ............................... 430/200, 201, 430/271.1

(56) References Cited

U.S. PATENT DOCUMENTS 5,278,023 A * 1/1994 Bills et al. .................. 430/201
5,501,937 A * 3/1996 Matsumoto et al. ........ 430/200
5,691,098 A * 11/1997 Busman et al. ............. 430/200
5,725,989 A 3/1998 Chang et al. ............... 430/200
5,747,217 A * 5/1998 Zaklika et al. .............. 430/200
5,935,902 A * 8/1999 Imamura .................... 430/200
6,235,445 B1 * 5/2001 Nakamura et al. .......... 430/200

FOREIGN PATENT DOCUMENTS

EP 0566103 10/1993

* cited by examiner

*Primary Examiner*—Richard L. Schilling
(74) *Attorney, Agent, or Firm*—Muserlian, Lucas and Mercanti

(57) ABSTRACT

A laser-induced thermal transfer ink sheet for forming a transfer image, comprising a support having thereon a light-to-heat converting layer containing a light-to-heat converting compound, an interlayer containing a resin, and an ink layer in that order, wherein the light-to-heat converting compound and the resin satisfy one of the following requirements (a) and (b);

(a) the light-to-heat converting compound is soluble in an organic solvent and the resin is soluble in water; and
(b) the light-to-heat converting compound is soluble in water and the resin is soluble in an organic solvent.

11 Claims, No Drawings

LASER-INDUCED THERMAL TRANSFER INK SHEET, PRODUCTION METHOD OF THE SAME, AND IMAGE RECORDING METHOD

FIELD OF THE INVENTION

The present invention relates to a laser-induced thermal transfer ink sheet capable of forming transferred images employing laser exposure.

BACKGROUND OF THE INVENTION

It has been known a recording method using thermal transfer recording. This recording is carried out by face-to-face contacting a thermal transfer recording material (an ink sheet) with an image receiving material, and then a heat source such as an electrothermal head controlled by electrical signals is brought into pressure contact with the back surface of said ink sheet. The thermal transfer recording material comprises a substrate having thereon a coloring material layer comprising heat fusible or heat sublimable dyes.

Features of said thermal transfer recording include minimum noise, maintenance-free, low cost, the ease of color image formation, and the capability of digital recording. Therefore, said thermal transfer recording has been employed in many fields such as various types of printers, recorders, facsimile machines, and computer terminals.

In recent years, in the medical and printing fields, it has been demanded a recording method which exhibits high resolution, and is capable of achieving high speed recording as well as image processing, or so-called digital recording. However, in the thermal transfer recording method which utilizes a conventional thermal head or electrothermal head as a heat source, it has been difficult to achieve high image density due to the limited life of the thermal elements of said head.

In order to overcome said drawbacks, thermal transfer recording, which utilizes a laser as a heat source, is proposed in Japanese Patent Publication Open to Public Inspection Nos. 49-15437, 49-17743, 57-87399, and 59-143659. In this system, since a laser beam can be condensed to several $\mu$m, resolving power can be markedly enhanced. However, when said laser beam is employed for recording, scanning type recording is generally utilized. As a result, problems occurred in which the speed of said scanning type recording is less than overall exposure utilizing masking materials and a recording method utilizing a line head. Furthermore, in order to provide the energy necessary for transfer employing laser beam exposure, a high output laser beam source is required, whereby it has been difficult to achieve commercially viable recording speed.

However, as light sources for optical communication as well as optical disks, high output semiconductor lasers as well as small-sized YAG lasers have been increasingly developed and units which are capable of achieving commercially viable recording speed have been developed. As a result, laser-induced thermal transfer recording has been applied to the preparation of the color proofs in the field of printing plate making, utilizing its particular recording characteristics.

In the printing plate making field, proposed has been high quality DDCP (direct digital color proof) capable of achieving halftone dot reproduction. Specifically, from the viewpoint of color, the uniform repeated output of images, and the high resolution, various systems, utilizing said laser-induced thermal recording, are comprised of promising techniques. In addition, laser-induced thermal transfer recording materials are demanded which are manufactured at lower cost and exhibit higher sensitivity, as well as excellent color reproduction.

Said laser-induced thermal transfer recording materials are divided into two types; one in which the ink layer is comprised of light-to-heat converting materials, and the other in which the ink layer is not comprised of said light-to-heat converting materials but said light-to-heat converting layer is provided separately from said ink layer. Among these, it is more advantageous to provide said light-to-heat converting layer separately from said ink layer because light-to-heat converting materials, having an absorption in the visible region, can be employed. Specifically, when color images are prepared, said configuration is more advantageous in terms of color reproduction. When applied to color proofs which require accurate color reproduction, it is desired that printing pigments are employed as coloring materials incorporated into the ink layer, and the light-to-heat converting layer and the ink layer are kept separate.

Further, it has been demanded an increased recording speed for said laser-induced thermal transfer recording. And further it has been desired that the employed laser-induced thermal transfer materials be increased in sensitivity. Japanese Patent Publication Open to Public Inspection Nos. 5-169861 and 6-122280 disclose techniques to provide a cushioning layer to form high sensitivity images in the image forming method in which each of the ink layers is transferred employing laser beam exposure. The cushion layer is normally provided between the support and the light-to-heat converting layer in order to be effectively functioned as a cushion.

U.S. Pat. No. 5,156,938 discloses a technique of an image forming method employing an ink layer which is subjected to ablation transfer by incorporating light-to-heat converting agents and sensitizers in said ink layer. In addition, U.S. Pat. Nos. 5,171,650, 5,256,506, and 5,501,938, and Japanese Patent Publication Open to Public Inspection No. 6-510490 disclose techniques which provide a dynamic releasing layer (DRL) such as an aluminum vacuum-evaporated layer under an ink layer which is subjected to ablation transfer.

In order to prepare high-sensitive laser-induced thermal transfer materials, it is effective to make the light-to-heat converting layer thinner and more light-absorptive, employing infrared absorbing dyes having a high absorption efficiency for the specific wavelengths of the laser beam, as light-to-heat converting agents which absorb a laser beam and convert it to thermal energy. However, problems occur in which color contamination occurs due to the transfer of said light-to-heat converting agents together with the ink layer.

Further, since said cushioning layer is adhesive, its incorporation increases production cost due to the requirement of special production facilities.

SUMMARY OF THE INVENTION

From the view of the foregoing, the present invention was achieved. An object of the present invention is to provide a laser-induced thermal transfer ink sheet which exhibits high sensitivity, decreased color contamination, excellent color reproduction, and high productivity.

The object of the present invention is achieved by the embodiments described below.

(1) A laser-induced thermal transfer ink sheet for forming a transfer image, comprising a support having thereon a light-to-heat converting layer containing a light-to-heat converting compound, an interlayer containing a resin, and an ink layer in that order, wherein the light-to-heat converting compound and the resin satisfy one of the following requirements (a) and (b):

(a) the light-to-heat converting compound is soluble in an organic solvent and the resin is soluble in water; and (b) the light-to-heat converting compound is soluble in water and the resin is soluble in an organic solvent.

(2) The laser-induced thermal transfer ink sheet of item (1), wherein the resin in the interlayer is soluble in an amount of at least 5 weight % in a solvent in which the solubility of the light-to-heat converting compound in the light-to-heat converting layer is at most 0.1 weight %.

(3) The laser-induced thermal transfer ink sheet of item (1), wherein the light-to-heat converting compound is soluble in an organic solvent and the resin is soluble in water.

(4) The laser-induced thermal transfer ink sheet of item (1), wherein the light-to-heat converting compound is soluble in water and the resin is soluble in an organic solvent.

(5) The laser-induced thermal transfer ink sheet of item (3), wherein the light-to-heat converting layer further comprises a binder resin and a hardening agent.

(6) The laser-induced thermal transfer ink sheet of item (4), wherein the interlayer further comprises a hardening agent.

(7) The laser-induced thermal transfer ink sheet of item (1), wherein the interlayer further comprises a sensitizing agent.

(8) The laser-induced thermal transfer ink sheet of item (7), wherein the sensitizing agent is selected from the group consisting of a self-oxidizing resin, a quinonediazide compound, an azo compound, a compound containing crystallization water and a sublimable compound.

(9) The laser-induced thermal transfer ink sheet of item 8, wherein the sensitizing agent is a sublimable compound having a color difference $\Delta E$ from a dye contained in the ink layer is less than 15, $\Delta E$ being measured with a CIE 1976 $L^*a^*b^*$ color difference formula defined by ISO 7724-1 and ISO 7724-3.

(10) The laser-induced thermal transfer ink sheet of item (1), wherein the interlayer further comprises a compound having a boiling point of 100 to 400° C. and the resin is soluble in water.

(11) The laser-induced thermal transfer ink sheet of item (10), wherein the compound has a boiling point of 150 to 300° C.

(12) A method of producing a laser-induced thermal transfer ink sheet for forming a transfer image, comprising the steps of:

(a) coating a first coating composition comprising a first solvent, a first resin and a light-to-heat converting compound on a support;

(b) drying the first solvent to form a light-to-heat converting layer;

(c) coating a second coating composition comprising a second solvent, a second resin and a compound having a boiling point of 100 to 400° C. on the light-to-heat converting layer;

(d) drying the second solvent to form the interlayer;

(e) coating a third coating composition comprising a third solvent, a third resin on the interlayer; and (f) drying the third solvent to form the ink layer, wherein each drying temperature in the steps (d) and (f) is independently below the boiling point of the compound in the second coating composition.

(13) The method of producing a laser-induced thermal transfer ink sheet of item (12), wherein the compound in the second coating composition has a boiling point of 150 to 250° C. and each drying temperature in the steps (d) and (f) is independently at least 20° C. below the boiling point of the compound in the second coating composition.

(14) A method for recording an image, comprising the steps of:

(i) providing a laser-induced thermal transfer ink sheet for forming a transfer image, comprising a support having thereon a light-to-heat converting layer containing a light-to-heat converting compound, an interlayer containing a resin and an ink layer in that order, wherein the light-to-heat converting compound and the resin satisfy one of the following requirements (a) and (b):

(a) the light-to-heat converting compound is soluble in an organic solvent and the resin is soluble in water; and (b) the light-to-heat converting compound is soluble in water and the resin is soluble in an organic solvent, (ii) providing a thermal transfer image receiving sheet comprising a support having thereon an image receiving layer;

(iii) superposing a surface of the ink layer of the thermal transfer ink sheet on the image receiving layer of the thermal transfer image receiving sheet;

(iv) directing a laser light onto the thermal transfer ink sheet to form an image, the laser light being modulated in accordance with digitally stored image information; and (v) separating the thermal transfer ink sheet and the thermal transfer image receiving sheet from each other, leaving the image residing on the image receiving sheet.

(vi) retransferring the image residing on the image receiving sheet onto a finishing substrate, whereby an image is formed. The finishing substrate is preferably a coated or uncoated paper.

DETAILED DESCRIPTION OF THE INVENTION

The present invention will now be detailed.

The present invention is characterized in that an interlayer is provided between the light-to-heat converting layer and the ink layer. It is assumed that said interlayer minimizes the diffusion of the light-to-heat converting compounds (being infrared absorbing dyes, when an infrared laser is employed as a beam source), incorporated into said light-to-heat converting layer provided on the support, to said interlayer or said ink layer during coating or drying and during storage after being produced as the ink sheet. As a result, said interlayer serves to increase the sensitivity, as well as to minimize sensitivity variation during storage.

Diffusion preventing or diffusion reducing properties of said interlayer, which reduce the diffusion of said light-to-heat converting dye, are evaluated as follows. An interlayer is laminated onto the light-to-heat converting layer and the resulting coating is kept in an oven at 120° C. for one minute. The cross-section of said heat-treated sheet is observed employing an optical microscope and the diffusion of said light-to-heat converting dye to said interlayer is evaluated. During this evaluation, the layer thickness is preferably adjusted to at least 1 μm so that the cross-section of said interlayer is easily observed. In order to evaluate the diffusion of the light-to-heat converting dye during the coating of the ink layer, only the coating solvent of the ink layer is coated and subsequently dried. The cross-section of the sheet, prepared as above, is observed employing an optical microscope, and the diffusion of the light-to-heat converting dye is evaluated.

Said interlayer comprises a binder and additives which are added if desired. In addition, by adding compounds having a 100 to 400° C. boiling point, an increase in sensitivity of the ink sheet can be achieved. Listed as such additives, added if desired, are cross-linking agents and surface active agents.

The thickness of the interlayer is preferably from 0.01 to 1.0 μm, and more preferably from 0.03 to 0.3 μm. When the thickness is too small, the reduction of the diffusion of the light-to-heat converting compound into the ink layer tends to be insufficient. When the thickness is too large, the sensitivity of the thermal transfer ink sheet tends to be decreased.

Though depending on the constitution of the light-to-heat converting layer, binders employed in the interlayer are those which are capable of minimizing the diffusion of light-to-heat converting dyes incorporated into the light-to-heat converting layer to the interlayer or the ink layer during coating as well as drying, and during storage after the production as the ink sheet. For example, it is possible to employ resins which are soluble in an amount of at least 5 percent in a solvent in which the solubility of the light-to-heat converting dye incorporated into the light-to-heat converting layer is no more than 0.1 percent.

When light-to-heat converting dyes are solvent-soluble (or oleophilic), it is preferable to employ water-soluble resins. Further, when light-to-heat converting dyes are water-soluble, it is preferable to employ resins which are soluble in organic solvents. Still further, it is preferable that the binder resins of the interlayer undergo cross-linking employing cross-linking agents.

Water-soluble resins used in the present invention have solubility in water in an amount of at least 5 weight % at 20° C. Resins which are soluble in organic solvent used in the present invention have solubility in water in an amount of less than 0.1 weight % at 20° C. and at the same time have solubility in organic solvents in an amount of at least 5 weight % at 20° C.

Organic solvents used in the present invention are preferably liquid at 20° C. More preferably they have boiling points from 50 to 200° C. and liquid at 20° C. Examples of organic solvents used in the present invention are: acetone, methyl ethyl ketone, methyl isobutyl ketone, cyclohexanone, cyclopentanone, methanol, ethanol, propanol, butanol, benzene, toluene, xylene, propylene glycol monomethyl ether, N-methyl-2-pyrrolidone, ethyl acetate and butyl acetate.

Listed as water-soluble resins which can be employed as binders of the interlayer are gelatin and casein, as well as modified resins thereof; cellulose esters such as methyl cellulose, hydroxymethyl propyl cellulose, hydroxypropyl cellulose, and carboxymethyl cellulose; water-soluble polyamide, water-soluble polyester, water-soluble acrylic resins; and polyvinyl alcohol and modified polyvinyl alcohol.

Further, employed as solvent-soluble resins may be common solvent-soluble resins. Of these, it is possible to specifically employ resins with a relatively high glass transition point (Tg) as well as with relatively high thermal conductivity such as common heat resistant resins including, for example, methyl polymethacrylates, polycarbonate, polystyrene, ethyl cellulose, nitrocellulose, polyvinyl chloride, polyamide, polyimide, polyether imide, polysulfone, polyether sulfone and aramide; and polythiophens, polyanilines, polyacetylenes, polyphenylenes, polyphenylene-sulfides, polypyrroles and derivatives thereof, or polymers comprised of these mixtures.

Isocyanate based compounds as cross-linking agents for binders include hexamethylene diisocyanates, trilenediisocyante, xylylene diisocyanate 1,3-bis (isocyanatomethyl)cyclohexane, 4,4-diphenylmethane diisocyanate, teramethylxylyene diisocyanate, isophorone diisocyante, naphthylene diisocyanates, and 4,4-methylenebis(cyclohexylisocyanate), and further, polymers thereof and addition products with polyhydric alcohol may be suitable selected and employed. Incidentally, these isocyanate based compounds may be employed individually or in combination.

Employed as compounds having an epoxy group in their molecule may be epoxy group containing cross-linkable compounds known in the art without any special limitation. Listed as specific compounds may be condensation polymerization products of Bisphenol A and epichlorohydrine, condensation polymerization products of hydrogenated Bisphenol A with epichlorohydrine, condensation polymerization products of brominated Bisphenol A and epichlorohydrine, condensation polymerization products of Bisphenol F with epichlorohydrine, glycidyl modified phenol nobolaks, glycidyl modified o-cresol nobolaks, aliphatic group polyglycidyl ether, polyglycol glycidyl ether, monoglycidyl ether, and tertiary carboxylic acid monoglycidyl ether. These may also be employed individually or in combination.

Employed as sensitizers incorporated into said interlayer may be self-oxidizing resins, quinonediazide derivatives, azo compounds, crystallization water containing compounds, and sublimable compounds.

Listed as self-oxidizing resins are polymers which undergo rapid acid catalyzed partial decomposition at desirably no more than 200° C. when measured under equilibrium conditions. Specific polymers include nitrocelluloses, polycarbonates, polymers reported in J. M. J. Frechet, F. Bouchard, J. M. Houlihan, B. Kryczke, and E. Eichler, J. Imaging Science, 30(2), pages 59 to 64, (1986), polyurethanes, polyesters, polyorthoesters, and polyacetals, and copolymers thereof. These polymers, as well as their decomposition mechanism, are detailed in said report by M. J. Frechet et al.

Quinonediazide derivatives as well as azo compounds can be selected from among those known in the art, but compounds are preferably employed which undergo decomposition by heat generated in the light-to-heat converting layer during laser exposure while generating nitrogen gas, and thereby become colorless.

Listed as specific examples of crystallization water-containing compounds are sodium primary phosphate, sodium secondary phosphate, sodium tertiary phosphate, sodium pyrophosphate, sodium topophosphate, sodium hexametaphosphate, sodium phosphite, potassium silicate, ferrous sulfate, cobalt sulfate, nickel sulfate, cobalt acetate, and nickel acetate.

Preferably employed as sublimable compounds are those having an vaporization temperature of at least 60° C. and generally called sublimable dyes. Said sublimable dyes are preferably sublimable compounds having a color difference ΔE with respect to a coloring material employed in the ink layer of no more than 15. ΔE can be measured with a CIE 1976 L*a*b* color difference formula defined by ISO 7724-1 and ISO 7724-3. CIE is an abbreviation of "Commission International de l'Eclairage". The ΔE, as described herein, refers to the value determined as follows. An employed sublimable dye and a suitable binder resin (being soluble in the solvent which dissolves said dye) are dissolved in a solvent, and the resultant solution is applied onto a support employing a wire bar, and subsequently dried, whereby a sublimable dye containing layer is prepared. During said operation, a sublimable dye containing layer is prepared employing a commercially available densitometer so that said sublimable dye containing layer exhibits a density difference of 0.05 with respect to the reflection density of the ink layer. Subsequently, ΔE is determined as the color difference between the color of said sublimable dye containing layer and the color of the employed ink layer. When the sublimable dye, having a color-difference ΔE of no more than 15, is incorporated into the interlayer, high sensitivity is obtained and the color variation of the ink layer is minimized due to the presence of said sublimable dye. Accordingly, the resulting images are suitable for color proofs.

An apparatus such as Spectrolino (made by Gretag Imaging Co. Ltd.) can be used to measure each L*a*b* value and then can be obtain ΔE.

The optimum amount of said sensitizers added to the interlayer varies depending on the kinds of employed interlayer binders and sensitizers. Said amount is preferably in the range of 10 to 100 percent by weight with respect to the interlayer binders, and is more preferably in the range of 20 to 60 percent by weight. However, when said sensitizers function as the binders, the interlayer may be comprised of said sensitizers themselves.

Compounds having a boiling point of 100 to 400° C., which can be incorporated into the interlayer, preferably have water solubility of no more than 5 percent by weight, and more preferably have the same of no more than 1 percent by weight.

Employed as a high-boiling-point solvents may be water-insoluble high-boiling-point organic solvents having a boiling point of at least 150° C. Listed as specific examples are phosphoric acid esters such as tricresyl phosphate, trioctyl phosphate, triphenyl phosphate, tri(2-ethylhexyl) phosphate, trihexyl phosphate, and tricyclohexyl phosphate; phthalic acid esters such as dimethyl phthalate, diethyl phthalate, dibutyl phthalate, di-2-ethylhexyl phthalate, butyl benzyl phthalate, and dioctyl phthalate; phosphine oxides such as trioctylphosphine oxide; chlorinated biphenyl, 2-nitrobiphenyl, o-toluenesulfonethyl amide, p-toluenesulfonethyl amide, di-2-ethylhexyl adipate, di-i-nonyl adipate, di-2-ethylhexyl sebacinate, butyl sebacinate, di-2-ethylhexyl maleate, and liquid paraffin. In addition, employed may be Compounds O-1 to O-6 described below.

O-1

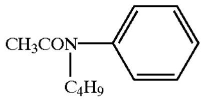

O-2

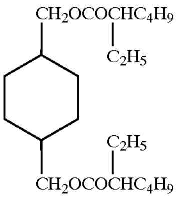

O-3

$C_{11}H_{23}CON(C_2H_5)_2$

O-4

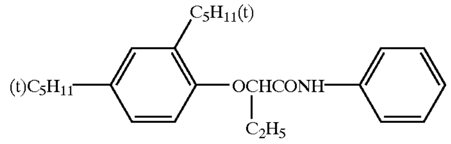

O-5

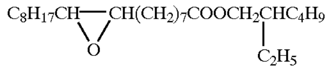

O-6

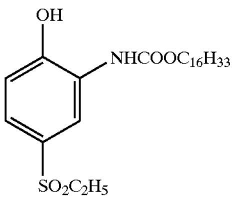

The dielectric constant of said high-boiling point organic solvents is preferably from 3.5 to 7.0. Naturally, at least two types of high-boiling organic solvents are employed in combination.

The support, the light-to-heat converting layer, and the ink layer will now be successively described below.

Any supports, which exhibit desired rigidity, excellent dimensional stability, and heat resistance during image formation, may be employed. Employed as specific examples may be plastic films comprised of polyethylene terephthalate (PET), polyethylene naphthalate (PEN), polycarbonate (PC), polymethyl methacrylate (PMMA), and polypropylene (PP).

From the viewpoint of physical properties of said films, the thickness of said supports is preferably in the range of 50 to 100 μm.

In the present invention, since images are formed by irradiating a laser beam onto the back surface of the ink sheet, the support is preferably transparent. Further, said support preferably exhibits rigidity as well as flexibility suitable for conveyance.

The light-to-heat converting layer is the layer which absorbs light or preferably a laser beam employed for exposure and converts it to heat energy. Said light-to-heat converting layer is basically comprised of binders and light-to-heat converting dyes, and if desired, cross-linking agents (being hardening agents). Surface active agents may also be incorporated into said layer.

Employed as said binders may be resins having a relatively high glass transition temperature, Tg, as well as relatively high thermal conductivity. Employed as examples of said resins may be common heat resistant resins such as methyl polymethacrylate, polycarbonate, polystyrene, ethyl cellulose, nitrocellulose, polyvinyl alcohol, polyvinyl chloride, polyamide, polyamido acid, polyimide, polyether imide, polysulfone, polyether sulfone, and aramide, polythiophenes, polyanilines, polyacetylenes, polyphenylenes, polyphenylene-sulfides, and polypyrroles, and derivatives thereof or polymers comprised of these mixtures.

Further, employed as binders in said light-to-heat converting layer may also be water-soluble polymers. Said water-soluble polymers are preferred because they improve the stripping properties of said layer from the ink layer, as well as improve heat resistance during laser beam irradiation, so that so-called scattering is minimized against suitable heating. When said water-soluble polymers are employed, it is preferable that light-to-heat converting materials are modified to be water-soluble (through substituting a sulfo group) or are subjected to water-based dispersion.

In order to increase the absorption efficiency of said light-to-heat converting layer at the wavelength of light emitted from the employed light source, said light-to-heat converting compounds should be selected and then used so that the maximum absorption wavelength of the resulting light-to-heat converting layer is near that of the light emitted from the light source. Further, when color images such as color proofs are formed, in order to minimize color contamination due to transfer of the light-to-heat converting layer, it is preferable that said light-to-heat converting dyes exhibit minimal absorption for light having a wavelength of 370 to 730 nm. Combinations of said light-to-heat converting compounds with said binders, which exhibit excellent compatibility, may be employed.

When for example, a semiconductor laser is employed as the light source, preferred as specific examples of said light-to-heat converting compounds are materials which have an absorption band in the near infrared region. Preferably employed as near infrared absorbing agents are, for example, carbon black; organic compounds such as cyanine based, polymethine based, azulenium based, squarylium based, thiopyrylium based, naphthoquinone based, or anthraquinone based dyes; and phthalocyanine based, azo based, or thioamide based organic metal complexes. Listed as specific compounds are those described in Japanese Patent Publication Open to Public Inspection Nos. 63-139191, 64-33547, 1-160683, 1-280750, 1-293342, 2-2074, 3-26593, 3-30991, 3-34891, 3-36093, 3-36094, 3-36095, 3-42281, 3-97589, and 3-103476. These may be employed individually or in combination.

Further, near infrared absorbing sensitizing dyes described in U.S. Pat. No. 5,156,938 are preferably employed. In addition, preferably employed are substituted arylbenzo(thio)pyrylium salts described in U.S. Pat. No. 3,881,924; trimethinethiapyrylium salts described in Japanese Patent Publication Open to Public Inspection No. 57-142645 (U.S. Pat. No. 4,327,169); pyrylium based compounds described in Japanese Patent Publication Open to Public Inspection Nos. 58-181051, 58-220143, 59-41363, 59-84248, 59-84249, 59-146063, and 59-146061; cyanine dyes described in Japanese Patent Publication Open to Public Inspection No. 59-216146; pentamethinethiopyrylium salts described in U.S. Pat. No. 4,283,475; and pyrylium compounds described in Japanese Patent Publication No. 5-13514 and 5-19702. Further, listed as other preferable examples as dyes may be near infrared absorbing dyes represented by formulas (I) and (II) described in U.S. Pat. No. 4,756,993. Of these dyes, listed as particularly preferred dyes are cyanine dyes, squarylium dyes, pyrylium dyes, and nickel thiolato complexes.

Specifically and preferably employed are compounds, represented by general formulas (1) through (9) described in Japanese Patent No. 2000-194369, such as thiopyrylium-squarylium dyes, thiopyrylium-croconium dyes, pyrylium-squarylium dyes or pyrylium-croconium dyes, selenapyrylium-squarylium dyes, selenapyrylium-croconium dyes, telluropyrylium-squarylium dyes, and telluropyrylium-croconium dyes, comprising a thiopyrilium nucleus, a pyrylium and squarylium nucleus, a croconium nucleus, a selenapyrylium nucleus, and a telluropyrylium nucleus.

Incidentally, the compounds comprising the squarylium nucleus, as described herein, refer to those having 1-cyclobutene-2-hydroxy-4-one in their molecular structure, while the compounds comprising the croconium nucleus refer to those having 1-cyclopentane-2-hydroxy-4,5-dione in their molecular structure. Herein said hydroxyl group may be dissociated.

The content of the light-to-heat converting materials in the light-to-heat converting layer may be determined so that absorbance at the wavelength of the light source is preferably from 0.3 to 3.0, and is more preferably from 0.5 to 2.0. When the thickness of a light-to-heat converting layer, which is prepared by employing carbon black, exceeds 1 $\mu$m, burning does not occur due to excessive heating of the ink layer, but the sensitivity tends to decrease. Further, said content varies depending on the intensity of the exposure laser beam as well as on the absorbance of said light-to-heat converting layer. Therefore, a content may be selected to suit.

The thickness of the light-to-heat converting layer is preferably in the range of 0.05 to 0.60 $\mu$m.

As the light-to-heat converting layer, it is possible to utilize vacuum-evaporated layers other than those previously described. In addition to carbon black and vacuum-evaporated metal black layer comprised of gold, silver, aluminum, chromium, nickel, antimony, tellurium, bismuth, and selenium, also listed may be vacuum-evaporated layers comprised of metal elements of Groups Ib, IIb, IIIa, IVb, Va, Vb, VIa, VIb, and VIIb in the Periodic Table and metal elements in Group VIII of the same, and alloys thereof, or alloys of these elements with elements in Groups Ia, IIa, and IIIb, or mixtures thereof. Particularly preferred metals include Al, Bi, Sn, In, or Zn, and alloys thereof, or alloys of these metals with elements in Groups Ia, IIa, and IIIb in the Periodic Table, or mixtures thereof. Suitable metal oxides and sulfides include those of Al, Bi, Sn, In, Zn, Ti, Cr, Mo, W, Co, Ir, Ni, Pb, Pt, Cu, Ag, Au, Zr, or Te, or mixtures thereof. Further, listed are vacuum-evaporated layers comprised of metal phthalocyanines, metal dithiolenes, and anthraquinones. The thickness of the vacuum-evaporated layers is preferably 500 Å or less.

Further, cross-linking agents to cross-link binder resins and surface active agents to improve coatability may be incorporated into the light-to-heat converting layer. Said cross-linking agents may be selected to suit and then employed in the same manner as those in the aforesaid interlayer.

An ink layer is comprised of coloring materials and binders. Other additives may be incorporated into said ink layer. Said ink layer is formed by applying a coating composition prepared by dissolving or dispersing these constituents in the solvents applied onto the interlayer.

In a laser-induced fusion thermal transfer method, the ink layer is fused or softened during heating and said layer itself, comprising coloring materials and binders, is capable of being transferred. Said transfer may be carried out while said ink layer is in a perfectly fused state.

Listed as said coloring materials may be, for example, inorganic pigments (titanium dioxide, carbon black, graphite, zinc oxide, Prussian Blue, cadmium sulfide, and iron oxide, and chromates of lead, zinc, barium, and calcium) and organic pigments (azo based, thioindigo based, anthraquinone based, anthoanthrone based, triphendioxazine based pigments, vat dye pigments, phthalocyanine pigments and derivatives thereof, and quinacridone pigments), and dyes (acidic dyes, direct dyes, dispersion dyes, oil-soluble dyes, metal-containing oil-soluble dyes or sublimable dyes).

When employed as materials to prepare color proofs, for example, preferably employed as yellow, magenta, and cyan, are C.I. 21095 or C.I. 21090, C.I. 15850:1, and C.I. 74160, respectively.

The content ratio of coloring materials in the ink layer may be adjusted so that the desired density is obtained at the desired layer thickness, and is not particularly limited. However, it is commonly in the range of 5 to 70 percent by weight, and is preferably in the range of 10 to 60 percent by weight.

Employed as binders of the ink layer are thermoplastic resins having a ring and ball softening point of 60 to 150° C. Further, thermally fusible materials as well as thermally softened materials may also be employed.

Said thermally fusible materials include generally solid or semi-solid materials having a melting point in the range of 40 to 150° C., which is determined employing a Yanagimoto JP-2 Type apparatus. Listed as specific examples are vegetable waxes such as carnauba wax, Japan tallow, ouricury wax, and ester wax; animal waxes such as beeswax, wax insect, shellac wax, and spermaceti; petroleum waxes such as paraffin wax, microcrystalline wax, polyethylene wax, ester wax and acid wax; mineral waxes such as montan wax, ozokerite, and ceresin; and in addition to said waxes, higher fatty acids such as palmitic acid, stearic acid, margaric acid, and behenic acid; higher alcohols such as palmityl alcohol, stearyl alcohol, behenyl alcohol, marganyl alcohol, myricyl alcohol, and eicosanol; higher fatty acid esters such as cetyl palmitate, myricyl palmitate, cetyl stearate, and myricyl stearate; amides such as acetamide, propionic acid amide, palmitic acid amide, stearic acid amide, and amide wax; and higher amines such as stearylamine, behenylamine, and palmitylamine.

Further, in the present invention, other than said thermoplastic resins, having a ring and ball softening point of 60 to 150° C., employed in combination may be elastomers such as natural rubber, styrene-butadiene rubber, isoprene rubber, chloroprene rubber, and diene based copolymers; rosin derivatives such as ester gum, rosin-maleic acid resins, rosin-phenol resins and hydrogenated rosin; and polymers such as phenol resin, terpene resins, cyclopentadiene resin, and aromatic hydrocarbon resins.

By suitably selecting said thermally fusible materials and thermoplastic materials, it is possible to prepare a thermally transferable ink layer having a desired thermoplastic point or thermally fusible point.

In the present invention, by employing binders which are easily subjected to thermal degradation, it is possible to form images utilizing ablation transfer. Employed as such binders may be self-oxidizing resins which have been employed as sensitizers of such interlayers.

Employed as image receiving layers which receive the ink layer of the ink sheet of the present invention may be any image receiving sheets for laser-induced thermal transfer which are known in the art. However, for the use of proofs, preferred are image receiving sheets which can be retransferred to final supports such as printing paper sheets. Listed as specific examples are image receiving sheets described in Japanese Patent Publication Open to Public Inspection Nos. 6-79980, 6-110043, 6-122280, 8-282140, and 9-52456. By combining any of these with the ink sheet of the present invention, it is possible to form images with high sensitivity as well as minimal color contamination.

EXAMPLES

The present invention will now be described with reference to examples. However, the present invention is not limited to these examples. Incidentally, "percent" in the examples is "percent by weight", unless otherwise specified.

Example 1

Ink Sheets 1 through 4 were prepared as described below.

<Ink Sheet 1>

The light-to-heat converting layer coating composition described below was applied onto a 75 μm thick polyethylene terephthalate (PET) film (T-100, manufactured by Mitsubishi Kagaku Polyester Co.) employing a wire bar and subsequently dried, whereby a light-to-heat converting layer was formed which had an absorbance of approximately 1.5 at 830 nm and a thickness of approximately 0.3 μm after drying. Subsequently, Interlayer Layer Coating Composition 1 described below was applied onto the resulting light-to-heat converting layer employing a wire bar and subsequently dried, whereby an approximately 0.1 μm thick interlayer was formed. The ink layer coating composition described below was then applied onto the resulting interlayer and subsequently dried so as to obtain a thickness of 0.4 μm after drying, whereby Ink Sheet 1 was prepared.

| (Light-to-heat converting Layer Coating Composition 1) | |
|---|---|
| Polyvinyl butyral (Denka Butyral #3000-4, manufactured by Denki Kagaku Kogyo Co.) | 8 parts |
| Infrared absorbing dye (IR-1) | 2 parts |
| Methyl ethyl ketone (MEK) | 60 parts |
| Cyclohexanone | 30 parts |

IR-1

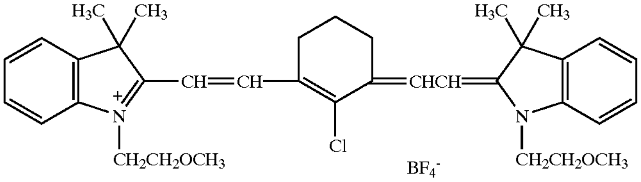

| (Interlayer Coating Composition 1) | |
|---|---|
| Polyvinyl alcohol (Gosenol ER-05, manufactured by Nihon Gosei Kagaku Kogyo Co.) | 5 parts |

-continued

| | |
|---|---|
| 1 percent aqueous solution of Fluorine based surface active agent (FT-251, manufactured by Neos Co.) | 5 parts |
| i-propyl alcohol | 10 parts |
| Water | 80 parts |
| (Ink Layer Coating Composition 1) | |
| Magenta pigment dispersion (MHI Magenta #8668, propyl alcohol dispersion of Brilliant Carmine, 19.5 percent solids, manufactured by Mikuni Shikiso Co.) | 38.6 parts |
| Polyvinyl butyral (Denka Butyral #2000-L, manufactured by Denki Kagaku Kogyo Co.) | 9.1 parts |
| Wax (stearic acid amide) | 1.0 part |
| Rosin based resin (KE-311, manufactured by Arakawa Kagaku Co.) | 1.5 parts |
| Antistatic agent (Chemistat 1100, manufactured by Sanyo Kasei Co.) | 0.4 part |
| Fluorine based surface active agent (Megafac F-178K), Dainippon Ink Kagaku Kogyo Co.) | 0.7 part |
| Propyl alcohol | 339 parts |
| MEK | 110 parts |

<Ink Sheet 2>

In the same manner as Ink Sheet 1, a light-to-heat converting layer, having an absorbance of approximately 1.5 at 830 nm and a thickness of approximately 0.3 $\mu$m after drying, was formed by applying Light-to-heat converting Layer Coating Composition 2 described below onto a 75 $\mu$m thick PET film, employing a wire bar, and subsequently drying the resulting coating. Subsequently, Interlayer Coating Composition 2 described below was applied onto the resulting light-to-heat converting layer, employing a wire bar, whereby an approximately 0.1 $\mu$m thick interlayer was formed. Thereafter, Ink Layer Coating Composition 2 described below was applied onto the resulting interlayer, employing a wire bar, whereby an ink layer having a thickness of 0.5 mm after drying was formed. The resulting sheet was designated as Ink Sheet 2.

| | |
|---|---|
| (Light-to-heat converting Layer Coating Composition 2) | |
| 10 percent aqueous gelatin solution | 30 parts |
| Infrared absorbing dye (IR-2) | 2 parts |
| i-propyl alcohol | 10 parts |
| Water | 58 parts |

IR-2

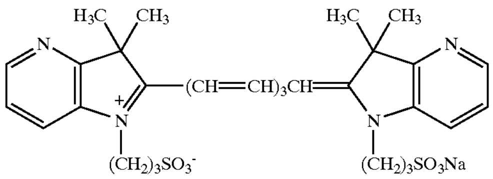

| | |
|---|---|
| (Interlayer Coating Composition 2) | |
| Polyimide resin (Rikacoat SN-20, 20 percent solids, manufactured by Shin-Nihonrika Co.) | 25 parts |
| Fluorine based surface active agent (Megafac F-178k, manufactured by Dainippon Ink Co) | 0.05 parts |
| N-methyl-2-pyrrolidone | 74.95 parts |
| (Ink Layer Coating Composition 2) | |
| Magenta pigment dispersion (MHI Magenta #8100, MEK dispersion of Brilliant Carmine, 19.5 percent solids, manufactured by Mikuni Shikiso Co.) | 48.8 parts |
| Polystyrene (Himer ST-95, manufactured by Sanyo Kasei Co.) | 13.4 parts |

-continued

| | |
|---|---|
| Styrene-butadiene block copolymer (Kraton D-1101CU, manufactured by Shell Kagaku Co.) | 0.8 part |
| Acrylic resin (RB-102, manufactured by Mitsubishi Rayon Co.) | 1.3 parts |
| Fluorine based surface active agent (Megafac F-178k, manufactured by Dainippon Ink Kagaku Kogyo Co.) | 0.2 parts |
| MEK | 339 parts |
| Cyclohexanone | 97 parts |

<Ink Sheet 3>

In the same manner as Ink Sheet 1, a light-to-heat converting layer having an absorbance of approximately 1.5 at 830 nm and a thickness of approximately 0.3 μm after drying was formed by applying Light-to-heat converting Layer Coating Composition 3 described below onto a 75 μm thick PET film, employing a wire bar, and subsequently drying the resulting coating. Subsequently, Interlayer Coating Composition 3 described below was applied onto the resulting light heat conversion layer, employing a wire bar, whereby an approximately 0.1 μm thick interlayer was formed. Thereafter, the aforesaid Ink Layer Coating Composition 2 was applied onto the resulting interlayer, employing a wire bar, and an ink layer having a thickness of 0.5 mm after drying was formed. The resulting sheet was designated as Ink Sheet 3.

| (Light-to-heat converting Layer Coating Composition 3) | |
|---|---|
| Polyvinyl butyral (Denka Butyral #3000-4, manufactured by Denki Kagaku Kogyo Co.) | 7.2 parts |
| Infrared absorbing dye (Compound IR-2) | 2 parts |
| Isocyanato compound (Sumijule N3500, manufactured by Sumitomo Kagaku Kogyo Co.) | 0.8 part |
| MEK | 200 parts |
| Cyclohexanone | 100 parts |

IR-3

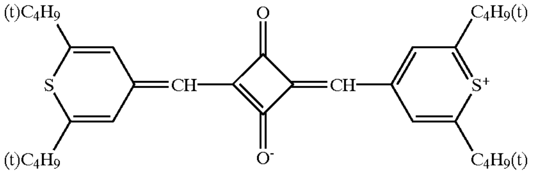

| (Interlayer Coating Composition 3) | |
|---|---|
| 10 Percent aqueous gelatin solution | 30 parts |
| i-Propyl alcohol | 10 parts |
| Water | 60 parts |

<Ink Sheet 4>

In the same manner as Ink Sheet 1, a light-to-heat converting layer having an absorbance of approximately 1.5 at 830 nm and a thickness of approximately 0.3 μm after drying was formed by applying Light-to-heat converting Layer Coating Composition 4 described below onto a 75 μm thick PET film, employing a wire bar, and subsequently drying the resulting coating. Subsequently, the aforesaid Interlayer Coating Composition 1 was applied onto the resulting light-to-heat converting layer, employing a wire bar, whereby an approximately 0.1 μm thick interlayer was formed. Thereafter, the aforesaid Ink Layer Coating Composition 2 was applied onto the resulting interlayer, employing a wire bar, and an ink layer having a thickness of 0.5 mm after drying was formed. The resulting sheet was designated as Ink Sheet 4.

| (Light-to-heat converting Layer Coating Composition 4) | |
|---|---|
| 10 percent aqueous gelatin solution | 30 parts |
| Infrared absorbing dye (IR-2) | 2 parts |
| 10 percent aqueous formalin solution | 3 parts |
| i-propyl alcohol | 10 parts |
| Water | 55 parts |

Subsequently an image receiving layer was prepared.

<Image Receiving Sheet>

After applying the backing layer coating composition described below onto a 100 μm thick PET film (T-100, manufactured by Mitsubishi Kagaku Polyester Co.) so as to obtain a coated weight of 2.5 $g/m^2$, employing a wire bar, and subsequently drying the resulting coating, Cushioning Layer Coating Composition described below was applied onto the surface opposite said backing layer so as to obtain a layer thickness of approximately 15 μm after drying, employing an applicator, whereby a cushioning layer was formed. Subsequently, onto the resulting cushioning layer, Stripping Layer Coating Composition, described below, was applied so as to obtain a coated weight of 2.3 g/$m^2$, employing a wire bar, and subsequently dried, whereby an image receiving sheet was prepared.

| | |
|---|---|
| (Backing Layer Coating Composition) | |
| Polyester resin (Biron 200, manufactured by Toyo Boseki Co.) | 8.7 parts |
| PMMA Resin particles (MX-1000, manufactured by Soken Kagaku Co.) | 0.3 part |
| 10 percent MEK dispersion of Carbon black (MHI Black #273, manufactured by Mikuni Shikiso Co.) | 5 parts |
| Cyclohexanone | 40 parts |
| Toluene | 20 parts |
| MEK | 26 parts |
| PMMA: poly (methyl methacrylate) | |
| (Cushioning Layer Coating Composition) | |
| Polyethylene latex (Hitech S-3127, manufactured by Toho Kagaku Kogyo Co.) | 94.3 parts |
| Pure water | 5.7 parts |
| (Stripping Layer Coating Composition) | |
| Ethyl cellulose (STD10 (PREM), manufactured by Dow Chemical Co.) | 9.5 parts |
| Methanol modified ethanol | 90.5 |
| (Image receiving Layer Coating Composition) | |
| Acrylic resin (Yodosol A5801, manufactured by Nihon SC Co.) | 22.0 parts |
| Fluorine resin (Unidyne TG810, manufactured by Daikin Kogyo Co.) | 4.4 parts |
| PMMA Resin particles (MX40S-2, manufactured by Soken Kagaku Co.) | 2.1 parts |
| Pure water | 62.8 parts |
| i-propyl alcohol | 8.7 parts |

<<Evaluation of Diffusibility of Light-to-Heat Converting Dye in Interlayer>>

Ink Sheets 1A through 4A were prepared so as to obtain a dried layer thickness of said interlayer of approximately 1 μm, employing said light-to-heat converting layer coating composition, the interlayer coating composition, and the ink layer coating composition of each of the aforesaid Ink Sheets 1 through 4. The resulting Ink Sheets 1A through 4A were placed in a 120° C. oven for one minute.

The interlayer of each Ink Sheet thus heated was peeled off with a piece of transparent adhesive tape (Sellotape No. 406, manufactured by Nichiban Co., Ltd). The absorbance of the Ink Sheet without the interlayer (Da) and that of the interlayer on the transparent adhesive tape (Db) were measured at a maximum absorption wavelength of the light-to-heat converting material. The ratio of Db/Da was calculated for each Ink Sheet 1A through 4A.

The degree of diffusion of the light-to-heat converting dye to the interlayer was subjected to three-level evaluation based on the criteria described below:

A: $Db/Da<0.05$ (Dye diffusion was not noticed.)

B: $0.05 \leqq Db/Da \leqq 0.3$ (Dye diffusion was noticed slightly.)

C: $0.3<Db/Da$ (Dye diffusion was clearly noticed.)

Subsequently, the ink layer of thermally treated Ink Sheet 1A was placed in face-to-face contact with the image receiving layer of Image receiving Sheet 1 and was passed through a laminator whereby the ink layer was transferred onto Image receiving Sheet 1. Further, ink color, which was formed by transferring from the image receiving layer to a 127 g/$m^2$ sheet of Tokubishi Art Paper (manufactured by Mitsubishi Seishi Co.), was measured. Separately, ink color, which was formed by transferring from thermally non-treated Ink Sheet 1 to Tokubishi Art Paper in the same manner, was measured. Subsequently, color difference $\Delta E$ between them was obtained. Incidentally, Spectrolino, manufactured by Gretag Co., was employed for said measurement under utilizing black backing. Regarding Ink Sheets 2 through 4, a color difference from thermally treated Ink Sheet 2A through 4A was obtained in the same manner as above.

<<Evaluation of Transfer Sensitivity>>

Each ink sheet and Image receiving Sheet 1 came into close contact under reduced pressure with the recording drum of EV-Laser Proofer of Color Decision System, manufactured by Konica Corp., so that the image receiving layer was placed in face-to-face contact with the ink layer, and a laser beam was exposed onto the back surface of said ink sheet. The intensity of said laser beam on said recording drum was set at 110 mW per inch, and said exposure was carried out at an exposure rotation frequency of 400 to 600 rpm. The exposed image receiving sheet was subjected to transfer to 127 g/$m^2$ Tokubishi Art Paper (manufactured by Mitsubishi Seishi Co.), employing EV-Laminator of said Color Decision System. Subsequently, the maximum exposure rotation frequency, which resulted in a constant reflection density of the solid exposure area, was obtained. Sensitivity was then obtained based on said exposure rotation frequency, the circumference length of said recording drum and the laser intensity.

<<Evaluation of Color>>

The color of the solid part of the transfer image, which had been prepared for the evaluation of the transfer sensitivity, was visually evaluated.

The evaluation results of said items are summarized in Table 1.

TABLE 1

| Ink Sheet | Diffusibility | Sensitivity (in mJ/$cm^2$) | Color | Remarks |
|---|---|---|---|---|
| 1 | B | 280 | good | Present Invention |
| 2 | B | 270 | good | Present Invention |
| 3 | A | 240 | very good | Present Invention |
| 4 | C | 320 | color contamination | Comparative Example |

The ink sheets according to the present invention resulted in desired properties for each item, and of them, Ink Sheet 3 was rated as excellent.

Example 2

Ink Sheets 5 through 8 were prepared as described below.

<Ink Sheet 5>

In the same manner as Ink Sheet 1, a light-to-heat converting layer having an absorbance of approximately 1.5 at 830 nm and a thickness of approximately 0.3 μm after drying was formed by applying Light-to-heat converting Layer Coating Composition 5, described below, onto a 75 μm thick PET film, employing a wire bar and subsequently drying the resulting coating. Subsequently, Interlayer Coating Composition 4, described below, was applied onto the resulting light-to-heat converting layer, employing a wire bar, whereby an approximately 0.1 μm thick interlayer was formed.

Subsequently, aforesaid Ink Layer Coating Composition 2 was applied onto the resulting interlayer, employing a wire bar, and an ink layer having a thickness of 0.5 mm after drying was formed, whereby Ink Sheet 5 was prepared.

| | |
|---|---|
| (Light-to-heat converting Layer Coating Composition 5) | |
| Polyvinyl butyral (Denka Butyral #3000-4, manufactured by Denki Kagaku Kogyo Co.) | 8 parts |
| Infrared absorbing dye (IR-3) | 2 parts |
| MEK | 200 parts |
| Cyclohexanone | 100 parts |
| (Interlayer Coating Composition 4) | |
| Methyl cellulose Metrose SM-15, manufactured by Shin-Etsu Kagaku Co.) | 2 parts |
| i-propyl alcohol | 10 parts |
| Water | 88 parts |

<Ink Sheet 6>

Ink Sheet 6 was prepared in the same manner as Ink Sheet 5, except that the light-to-heat converting layer of Ink Sheet 5 was replaced with aforesaid Light-to-heat converting Layer Coating Composition 3.

<Ink Sheet 7>

Ink Sheet 7 was prepared in the same manner as Ink Sheet 2, except that the interlayer layer of Ink Sheet 2 was replaced with Interlayer Coating Composition 5 described below.

| | |
|---|---|
| (Interlayer Coating Composition 5) | |
| Polyvinyl butyral (Denka Butyral #3000-4, manufactured by Denki Kagaku Kogyo Co.) | 9 parts |
| Isocyanato compound (Sumijule N3500, manufactured by Sumitomo Kagaku Kogyo Co.) | 1 part |
| MEK | 260 parts |
| Cyclohexanone | 130 parts |

<Ink Sheet 8>

Ink Sheet 8 was prepared in the same manner as Ink Sheet 5, except that the interlayer layer of Ink Sheet 5 was replaced with Interlayer Coating Composition 6 described below.

| | |
|---|---|
| (Interlayer Coating Composition 6) | |
| Ethyl cellulose (STD10 (PREM), manufactured by Dow Chemical Co.) | 9 parts |
| Isocyanato compound (Sumijule N3500, manufactured by Sumitomo Kagaku Co.) | 1 part |
| MEK | 390 parts |

<<Evaluation of Diffusibility of Light-to-Heat Converting Dye in Interlayer>>

Employing the light-to-heat converting layer coating composition and the interlayer coating composition of each of the aforesaid Ink Sheets 5 through 8, coating was performed so as to obtain an interlayer thickness of approximately 1 $\mu$m, while employing the same conditions for the light-to-heat converting layer. Subsequently, an ink layer coating solvent was coated under the same conditions employed to coating the ink layer and subsequently dried, whereby Ink Sheets 5A through 8A were prepared.

The resulting Ink Sheets 5A through 8A were subjected to the evaluation test which were applied to Ink Sheet 1A through 4A. The degree of diffusion of the light-to-heat converting dye into the interlayer was subjected to a three-level evaluation based on the criteria specified below:

A: Db/Da<0.05 (Dye diffusion was not noticed.)

B: $0.05 \leqq Db/Da \leqq 0.3$ (Dye diffusion was noticed slightly.)

C: 0.3<Db/Da (Dye diffusion was clearly noticed.)

<<Evaluation 2 of Diffusibility of Light-to-Heat Converting Dye in Interlayer>>

Each of Ink Sheets 5 through 8 was passed through a laminator so that the ink layer was placed in face-to-face contact with the image receiving layer of Image receiving Sheet 1, and said ink layer was transferred onto said Image receiving Sheet 1. Further, transfer was carried out from said Image receiving Sheet to a 127 g/m$^2$ sheet of Tokubishi Art Paper (manufactured by Mitsubishi Seishi Co.). Subsequently, a 830 nm reflection density of the transferred ink was determined.

Table 2 shows the summarized results of evaluations 1 and 2 of diffusibility of light-to-heat converting dye of the aforesaid interlayer, and the transfer sensitivity as well as the color of the solid area of the transfer image which are the same as Example 1.

TABLE 2

| Ink Sheet | Diffusibility 1 | Diffusibility 2 | Sensitivity (in mJ/cm$^2$) | Color | Remarks |
|---|---|---|---|---|---|
| 5 | A | 0.05 | 270 | very good | Present Invention |
| 6 | A | 0.05 | 250 | very good | Present Invention |
| 7 | A | 0.05 | 260 | good | Present Invention |
| 8 | A | 0.35 | 310 | slight color contamination | Comparative Example |

Ink sheets according to the present invention exhibit excellent diffusibility 1 as well as excellent diffusibility 2 and result in no color contamination.

Example 3

Ink Sheets 9 through 14 were prepared as described below.

<Ink Sheet 9>

Ink Sheet 9 was prepared in the same manner as Ink Sheet 3, except that the interlayer coating composition was replaced with Interlayer Coating Composition 7 described below. The thickness of the interlayer was adjusted to approximately 0.2 $\mu$m.

| | |
|---|---|
| (Interlayer Coating Composition 7) | |
| 10 percent aqueous gelatin solution | 40 parts |
| Naphthoquinonediazide | 1 part |
| i-propyl alcohol | 10 parts |
| Water | 49 parts |

<Ink Sheet 10>

Ink Sheet 10 was prepared in the same manner as Ink Sheet 9, except that the interlayer coating composition was replaced with Interlayer Coating Composition 8 described below.

| (Interlayer Coating Composition) | |
|---|---|
| 10 percent aqueous gelatin solution | 10 parts |
| 10 percent aqueous cobalt sulfate solution | 1 part |
| i-propyl alcohol | 5 parts |
| Water | 34 parts |

<Ink Sheet 11>

Ink Sheet 11 was prepared in the same manner as Ink Sheet 9, except that the interlayer coating composition was replaced with Interlayer Coating Composition 9 described below and said Ink Layer Coating Composition 1 was employed. The thickness of the interlayer was adjusted to approximately 0.2 μm, while the thickness of the ink layer was adjusted to approximately 0.4 μm.

| (Interlayer Coating Composition 9) | |
|---|---|
| Polyimide resin (Rikacoat SN-20, 20 percent solids, manufactured by Shin-Nihonrika Co.) | 40 parts |
| Azo-i-butylonitrile | 2 parts |
| Fluorine based surface active agent (Megafac F-178k, manufactured by Dainippon Ink Kagaku Kogyo Co.) | 0.1 part |
| N-methyl-2-pyrrolidone | 158 parts |

<Ink Sheet 12>

Ink Sheet 12 was prepared in the same manner as Ink Sheet 11, except that the interlayer coating composition was replace with Interlayer Coating Composition 10.

| (Interlayer Coating Composition) | |
|---|---|
| Nitrocellulose (Cellunoba BTH1/4, 70 percent solids, manufactured by Asahi Kasei Kogyo Co.) | 4 parts |
| MEK | 76 parts |
| Cyclohexanone | 20 parts |

<Ink Sheet 13>

Ink Sheet 13 was prepared in the same manner as Ink Sheet 11, except that the interlayer coating composition was replaced with Interlayer Coating Composition 11 described below.

| (Interlayer Coating Composition 11) | |
|---|---|
| Polyester resin (Biron 200, manufactured by Toyo Boseki Co.) | 3 parts |
| Sublimable dye (Kayaset Red B, manufactured by Nihon Kayaku Co.) | 1 part |
| Isocyanato compound (Symujule N3500, manufactured by Sumitomo Kagaku Kogyo Co.) | 1 part |

-continued

| | |
|---|---|
| MEK | 240 parts |
| Cyclohexanone | 50 parts |

<Ink Sheet 14>

Ink Sheet 14 was prepared in the same manner as Ink Sheet 11, except that the interlayer coating composition was replaced with Interlayer Coating Composition 12 described below.

| (Interlayer Coating Composition 12) | |
|---|---|
| Polyester resin (Biron 200, manufactured by Toyo Boseki Co.) | 3 parts |
| MEK | 77 parts |
| Cyclohexanone | 20 parts |

TABLE 3

| Ink Sheet | Sensitivity (in mJ/cm$^2$) | Color | Remarks |
|---|---|---|---|
| 9 | 230 | very good | Present Invention |
| 10 | 220 | very good | Present Invention |
| 11 | 240 | good | Present Invention |
| 12 | 240 | some color contamination | Present Invention |
| 13 | 260 | some color contamination | Present Invention |
| 14 | 330 | some color contamination | Present Invention |

The ink sheets of the present invention exhibited high sensitivity as well as desired color.

Example 4

Ink Sheets 15 through 17 were prepared as described below.

<Ink Sheet 15>

In the same manner as Ink Sheet 3, after forming a light-to-heat converting layer on the support, Interlayer Coating Composition 13, described below, was applied onto the resulting light-to-heat converting layer, employing a wire bar, and subsequently dried, whereby an approximately 0.4 μm thick interlayer was formed. Subsequently, Ink Layer Coating Composition 3, described below, was applied onto the resulting interlayer, employing a wire bar, and subsequently dried, whereby a 0.5 μm thick ink layer, after drying, was formed. Thus, an ink sheet was prepared.

<Preparation of Liquid Paraffin Dispersion>

A liquid paraffin mixture consisting of the composition described below was prepared and was dispersed while stirring, employing an ultrasonic homogenizer, so that the diameter of dispersed particles approached approximately 100 nm.

| (Liquid Paraffin Dispersion) | |
|---|---|
| Liquid paraffin (having a boiling point of approximately 320° C.) | 10 g |
| Ethyl acetate | 10 g |
| 5 percent aqueous gelatin solution | 60 g |
| 10 percent aqueous sodium (2-ethylhexyl) sulfosuccinate solution | 4 g |

| (Interlayer Coating Composition 13) | |
|---|---|
| Liquid paraffin dispersion | 4 parts |
| 10 percent aqueous gelatin solution | 32 parts |
| 5 percent aqueous surface active agent (FT251, manufactured by Neos Co.) | 1 part |
| i-propyl alcohol | 10 parts |
| Water | 53 parts |

| (Ink Layer Coating Composition 3) | |
|---|---|
| Magenta pigment dispersion (MHI Magenta #8100, MEK dispersion of Brilliant Carmine, 19.5 percent solids, manufactured by Mikuni Shikiso Co.) | 49 parts |
| Acrylic resin (BR-105, manufactured by Mitsubishi Rayon Co.) | 13 parts |
| Wax (stearic acid amide) | 1 part |
| Fluorine based surface active agent (Megafac F-178K, manufactured by Dainippon Ink Kagaku Kogyo Co.) | 0.2 part |
| Propyl alcohol | 339 parts |
| MEK | 110 parts |

<Ink Sheet 16>

Ink Sheet 16 was prepared in the same manner as Ink Sheet 15, except that the interlayer coating composition was replaced with Interlayer Coating Composition 14 described below. The thickness of the resulting interlayer was adjusted to 0.5 $\mu$m.

Initially, a trioctylsulfone oxide mixture consisting of the composition described below was prepared and was dispersed while stirring, employing an ultrasonic homogenizer, so that the diameter of said dispersed particles approached approximately 100 nm.

| (Trioctylsulfone Oxide Dispersion) | |
|---|---|
| Trioctylsulfone oxide | 10 g |
| Ethyl acetate | 10 g |
| 5 Percent aqueous gelatin solution | 60 g |
| 10 percent aqueous sodium di(2-ethylhexyl)sulfosuccinate solution | 4 g |

| (Interlayer Coating Composition 14) | |
|---|---|
| Trioctylsulfone oxide dispersion | 4 parts |
| 10 percent aqueous gelatin solution | 32 parts |
| 5 percent aqueous surface active agent (FT251, manufactured by Neos Co.) | 1 part |
| i-propyl alcohol | 10 parts |
| Water | 53 parts |

<Ink Sheet 17>

Ink Sheet 17 was prepared in the same manner as Ink Sheet 15, except that the interlayer coating composition was replaced with aforesaid Interlayer Coating Composition 3. The thickness of the resulting interlayer was adjusted to 0.5 $\mu$m.

In the same manner as Example 1, the evaluation results of transfer sensitivity and color of solid color are summarized in Table 4.

TABLE 4

| Ink Sheet | Sensitivity (in mJ/cm$^2$) | Color | Remarks |
|---|---|---|---|
| 15 | 240 | very good | Present Invention |
| 16 | 250 | very good | Present Invention |
| 17 | 350 | very good | Present Invention |

The ink sheet of the present invention exhibited high sensitivity as well as excellent color.

The present invention is capable of providing a laser induced thermal transfer ink sheet which exhibits high sensitivity, no color contamination, and excellent color reproduction.

What is claimed is:

1. A laser-induced thermal transfer ink sheet for forming a transfer image, comprising a support having thereon a light-to-heat converting layer containing a light-to-heat converting compound, a binder resin and a hardening agent, an interlayer containing a resin, and an ink layer in that order, wherein the light-to-heat converting compound and the resin satisfy one of the following requirements (a) and (b):

(a) the light-to-heat converting compound is soluble in an organic solvent and the resin is soluble in water; and (b) the light-to-heat converting compound is soluble in water and the resin is soluble in an organic solvent.

2. The laser-induced thermal transfer ink sheet of claim 1, wherein the resin in the interlayer is soluble in an amount of at least 5 weight % in a solvent in which the solubility of the light-to-heat converting compound in the light-to-heat converting layer is at most 0.1 weight %.

3. The laser-induced thermal transfer ink sheet of claim 1, wherein the light-to-heat converting compound is soluble in an organic solvent and the resin is soluble in water.

4. The laser-induced thermal transfer ink sheet of claim 1, wherein the light-to-heat converting compound is soluble in water and the resin is soluble in an organic solvent.

5. The laser-induced thermal transfer ink sheet of claim 4, wherein the interlayer further comprises a hardening agent.

6. The laser-induced thermal transfer ink sheet of claim 1, wherein the interlayer further comprises a sensitizing agent.

7. The laser-induced thermal transfer ink sheet of claim 6, wherein the sensitizing agent is selected from the group consisting of a self-oxidizing resin, a quinonediazide compound, an azo compound, a compound containing crystallization water and a sublimable compound.

8. The laser-induced thermal transfer ink sheet of claim 7, wherein the sensitizing agent is a sublimable compound having a color difference ΔE from a dye contained in the ink layer is less than 15, ΔE being measured with a CIE 1976 L*a*b* color difference formula defined by ISO 7724-1 and ISO 7724-3.

9. The laser-induced thermal transfer ink sheet of claim 1, wherein the interlayer further comprises a compound having a boiling point of 100 to 400° C. and the resin is soluble in water.

10. The laser-induced thermal transfer ink sheet of claim 9, wherein the compound has a boiling point of 150 to 300° C.

11. A method for recording an image, comprising the steps of:

(i) providing a laser-induced thermal transfer ink sheet for forming a transfer image, comprising a support having thereon a light-to-heat converting layer containing a light-to-heat converting compound, a binder resin and a hardening agent, an interlayer containing a resin and an ink layer in that order, wherein the light-to-heat converting compound and the resin satisfy one of the following requirements (a) and (b):

(a) the light-to-heat converting compound is soluble in an organic solvent and the resin is soluble in water; and (b) the light-to-heat converting compound is soluble in water and the resin is soluble in an organic solvent, (ii) providing a thermal transfer image receiving sheet comprising a support having thereon an image receiving layer;

(iii) superposing a surface of the ink layer of the thermal transfer ink sheet on the image receiving layer of the thermal transfer image receiving sheet;

(iv) directing a laser light onto the thermal transfer ink sheet to form an image, the laser light being modulated in accordance with digitally stored image information; and (v) separating the thermal transfer ink sheet and the thermal transfer image receiving sheet from each other, leaving the image residing on the image receiving sheet.

* * * * *